United States Patent [19]
Yamazaki

[11] Patent Number: 5,262,654
[45] Date of Patent: Nov. 16, 1993

[54] DEVICE FOR READING AN IMAGE HAVING A COMMON SEMICONDUCTOR LAYER

[75] Inventor: Shunpei Yamazaki, Tokyo, Japan

[73] Assignee: Semiconductor Energy Laboratory Co., Ltd., Kanagawa, Japan

[21] Appl. No.: 792,936

[22] Filed: Nov. 15, 1991

[30] Foreign Application Priority Data

Nov. 30, 1990 [JP] Japan ............... 2-339055

[51] Int. Cl.$^5$ ............................................. H01L 27/14
[52] U.S. Cl. ......................................... 257/53; 257/59; 257/292; 257/443; 257/291
[58] Field of Search .............. 257/59, 291, 292, 443, 257/446, 447, 458, 53, 55

[56] References Cited

U.S. PATENT DOCUMENTS

| | | | |
|---|---|---|---|
| 4,827,146 | 5/1989 | Ogawa et al. | 257/291 X |
| 4,889,983 | 12/1989 | Numano et al. | 257/292 X |
| 4,906,856 | 3/1990 | Iwanami et al. | 257/291 X |
| 4,988,631 | 1/1991 | Ogawa et al. | 257/59 X |
| 5,032,885 | 7/1991 | Shiga | 257/458 X |
| 5,034,794 | 7/1991 | Murotani | 257/458 X |
| 5,043,785 | 8/1991 | Mizutani et al. | 257/443 |
| 5,051,803 | 9/1991 | Kitamura et al. | 257/458 X |
| 5,097,120 | 3/1992 | Kitamura et al. | 257/458 |

Primary Examiner—William Mintel
Attorney, Agent, or Firm—Sixbey, Friedman, Leedom & Ferguson

[57] ABSTRACT

A device for reading an image (an image reading device) according to this invention comprises therein at least one photoelectric conversion semiconductor device provided on a substrate and at least one thin film transistor circuit element provided on the substrate wherein said photoelectric conversion semiconductor device and said thin film transistor circuit element comprise semiconductor regions obtained from one semiconductor film provided on said substrate. The device for reading an image is produced by a process comprising the steps of: depositing a semiconductor material on a substrate; forming a photoelectric conversion semiconductor device on said substrate, a semiconductor region of said photoelectric conversion semiconductor device being made of said semiconductor material; and forming a thin film transistor on said substrate, a semiconductor region of said thin film transistor being made of said semiconductor material, wherein said thin film transistor constitutes an electric circuit required to read an image.

14 Claims, 4 Drawing Sheets

DEVICE FOR READING AN IMAGE HAVING A COMMON SEMICONDUCTOR LAYER

BACKGROUND OF THE INVENTION

1. Field of the Invention

This invention relates to a device for reading an image (an image reading device), and more particularly to a device for reading an image (an image reading device) having photoelectric conversion devices arranged in a transverse direction to an original, which is usable for a facsimile machine, an image reader, a digital copying machine and the like.

2. Description of the Prior Art

As this type of image reading apparatus as described above have been conventionally known three types of image reading devices such as a non-contact type, a close contact type and an entirely-close contact type. Recently, in association with requirement for a compact and lightweight type of facsimile machine, image reader, digital copying machine or the like, the image reading apparatus itself is required to be compact and lightweight. This requirement causes the close contact and entirely-close contact types to be mainly propagated in the market. However, a more compact and lightweight of image reading device has been further required for these types.

In addition, an image which is read out by the image reading device is required to be outputted with image quality of high precision and high gradation at high speed, and thus an image reading device having high photosensitivity and photoresponsivity has been also required.

Further, a photoconductor or photodiode type has been generally known as a photoelectric conversion device which is used in the image reading device. The photoconductor type allows a large amount of current to flow therethrough, but has low photoresponsivity. Inversely, the diode type permits only a small amount of current to flow therethrough, but has very excellent photoresponsivity. Recently, the photodiode type has been mainly utilized to satisfy the requirement for obtaining high gradation.

As an example of the diode type serving as the photoelectric conversion device has been well know a semiconductor structure in which PN or PIN junction is formed on a silicon substrate or an insulating substrate with monocrystal silicon semiconductor, polycrystal silicon semiconductor or amorphous silicon semiconductor. A conventional photoelectric conversion device is designed as a best device so that semiconductor layers having a PN or PIN junction are laminated on a monocrystal silicon substrate or an insulating substrate and positive and negative electrodes are formed on the top and bottom surfaces of the semiconductor layers in a laminating direction of the semiconductor layers. Further, the junction surface of the PN or PIN junction has been conventionally designed substantially in parallel with the principal plane of the semiconductor layers or the substrate to irradiate a large amount of light onto the junction surface.

As described above, since the conventional photoelectric conversion device has the junction surface formed in parallel with the principal plane of the semiconductor layers or the substrate, an electric field which is generated inside of the semiconductor layers through the PN or PIN junction is directed perpendicularly to a light-irradiating surface (plane) and thus the intensity of the irradiated light is inhomogeneous in the direction of the electric field. As a result, it is difficult to effectively generate electrons/holes in the conventional photoelectric conversion device and output them to the outside.

Further, the photoelectric conversion device using amorphous semiconductor has a disadvantage that it is difficult to effectively take out carriers generated in the semiconductor by light irradiation to the outside because the semiconductor material has a short diffusion length.

As described above, miniaturization, high photoresponsibility and effectivity of photosensitivity have been insufficient to the conventional image reading device, and thus a further development has been required for the conventional image reading device. In addition, a lower cost has been also required for this type of image reading device.

SUMMARY OF THE INVENTION

In order to overcome the above disadvantage of the prior art, an object of this invention is to provide a device for reading an image (an image reading device) which has a compact structure, high photoresponsibility and highly-effective photosensitivity and is capable of reading out an image with high precision and high gradation.

In order to attain the foregoing and other objects, a device for reading an image (an image reading device) according to the present invention comprises therein at least one photoelectric conversion semiconductor device provided on a substrate and at least one thin film transistor circuit element provided on the substrate wherein said photoelectric conversion semiconductor device and said thin film transistor circuit element comprise semiconductor regions obtained from one semiconductor film provided on said substrate.

In the photoelectric conversion device used in the device for reading an image (image reading device), an electric field which is generated by the P-type or N-type impurity region thereof is directed in parallel with a light-irradiating surface (plane).

The device for reading an image is produced by a process comprising the steps of: depositing a semiconductor material on a substrate; forming a photoelectric conversion semiconductor device on said substrate, a semiconductor region of said photoelectric conversion semiconductor device being made of said semiconductor material; and forming a thin film transistor on said substrate, a semiconductor region of said thin film transistor being made of said semiconductor material, wherein said thin film transistor constitutes an electric circuit required to read an image.

The photoelectric conversion device and the thin film transistor are formed of the same semiconductor film, and formation of impurity semiconductor regions of the photoelectric conversion device and that of the thin film transistor are carried out at the same time, e.g. by ion implantation, thereby implementing simplification of a manufacturing process and reduction of a manufacturing cost.

That is, in accordance with the present invention, a method for forming a device for reading an image comprising photoelectric conversion semiconductor devices provided on a substrate, an electric circuit required to read an image, and thin film transistors provided on said substrates and constituting at least a part of said electric circuit comprises: forming a semiconductor film on said substrate; forming on said substrate said photoelectric conversion semiconductor devices, semiconductor regions of said photoelectric conversion semiconductor devices being made from said semiconductor film; forming on said substrate said thin film transistors, semiconductor regions of said thin film transistors being made from said semiconductor film; forming impurity semiconductor regions in said photoelectric conversion semiconductor devices; and forming impurity semiconductor regions in said thin film transistors at the same time as the formation of said impurity semiconductor regions in said photoelectric conversion semiconductor devices is carried out.

Alternatively, in accordance with the present invention, a method for forming a device for reading an image comprising photoelectric conversion semiconductor devices provided on a substrate and comprising p-type impurity semiconductor regions and n-type impurity semiconductor regions, an electric circuit required to read an image, and p-type and n-type thin film transistors provided on said substrate and constituting at least a part of said electric circuit comprises: forming a semiconductor film on said substrate; forming on said substrate said photoelectric conversion semiconductor devices, semiconductor regions of said photoelectric conversion semiconductor devices being made from said semiconductor film; forming on said substrate said p-type and n-type thin film transistors, semiconductor regions of said p-type and n-type thin film transistors being made from said semiconductor film; forming said p-type impurity semiconductor regions in said photoelectric conversion semiconductor devices; forming source and drain impurity regions of the p-type thin film transistors at the same time as the formation of said p-type impurity semiconductor regions is carried out; forming said n-type impurity semiconductor regions in said photoelectric conversion semiconductor devices; and forming source and drain impurity regions of the n-type thin film transistors at the same time as the formation of said n-type impurity semiconductor regions is carried out.

In addition, the thin film transistor (TFT) which serves as at least a part of an image reading circuit may be of a complementary structure. In this case, simultaneously with formation of a P-channel transistor, the P-type impurity region of the photoelectric conversion device may be formed using the same photomask. Likewise, simultaneously with formation of an N-channel transistor, the N-type impurity region of the photoelectric conversion device may be formed using the same photomask.

Further, the semiconductor film may be composed of semi-amorphous or semi-crystal semiconductor. In this case, the semiconductor film has a long diffusion length which can not be obtained by amorphous semiconductor, and a large absorption coefficient which is not obtained by monocrystal or polycrystal semiconductor. Therefore, the semiconductor film can be thinned and the photoelectric conversion device having a long diffusion length can be manufactured.

Still further, the semiconductor film thus obtained has an electrical characteristic of 10 to 200 cm$^2$/Vsec in hole mobility, and 15 to 300 cm$^2$/Vsec in electron mobility. Therefore, the TFT has a remarkably high photoresponsibility.

In the photoelectric conversion device thus constructed, those carriers which are generated in a photoelectric converting area between the P-type and N-type diffusion regions can be effectively outputted to the outside because of the long diffusion length of the semiconductor layers. In addition, since the P-type and N-type impurity regions are formed in a direction of depth (in a laminating direction) of the same semiconductor film from the light-irradiating surface of the semiconductor film, the intensity of the irradiated light is constant in the direction of the electric field between the P-type and N-type impurity regions, so that photoelectric conversion efficiency is improved.

PREFERRED EMBODIMENTS OF THE INVENTION

Figure 1A:
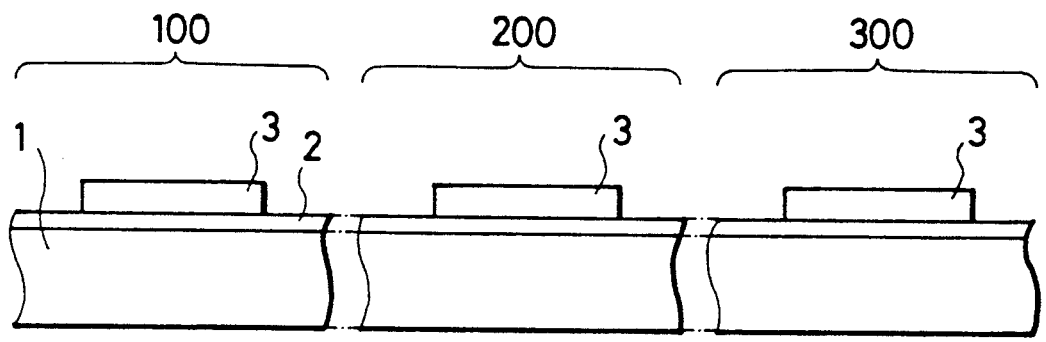
FIGS. 1(A) to 1(F) are longitudinal-sectional views for a manufacturing process of the image reading device according to this invention.

Preferred embodiments according to this invention will be described with reference to the accompanying drawings.

Before describing the detailed construction of the embodiments of this invention, a mechanism of semi-amorphous or semi-crystal semiconductor which is used in this invention will be first described in brief.

A semi-amorphous or semi-crystal semiconductor film of this invention is formed by forming a film by an LPCVD method, a sputtering method, a PCVD method or the like, and then subjecting it to a thermal-crystallization process. The formation of the semi-amorphous or semi-crystal semiconductor film using the sputtering method will be representatively described hereunder.

Monocrystal silicon semiconductor serving as a target is sputtered by a mixed gas of hydrogen and argon to separate atomic silicon from the target due to the sputtering (impinging) of heavy atoms of argon upon the target. The separated silicon atoms flight to a substrate and is deposited on a film-forming surface of the substrate. At the same time, an agglomerate into which atoms of several tens to several hundred thousands are assembled is also separated as a cluster from the target, flights to the substrate and is deposited on the film-forming surface of the substrate. During the flight of the silicon atoms and clusters, the hydrogen atoms bond to dangling bonds of the silicon atoms on the peripheral surface of the clusters. These clusters having Si-H bonds on the peripheral surface thereof are orderly deposited on the film-forming surface of the substrate and form an area in which the clusters are arranged with relatively high order (regularity) on the film-forming surface (hereinafter referred to as "high-orderly area"). That is, the highly-orderly clusters having the Si-H bonds on the peripheral surface thereof and the pure amorphous silicon are mixed deposited on the film-forming surface of the substrate. The deposited mixture is subjected to a heat treatment at 450° C. to 700° C. in non-oxidation (non-oxide) gas atmosphere to react each Si-H bond on the peripheral surface of the clusters with another Si-H bond of the clusters and form Si-Si bonds, so that a silicon semiconductor film is formed on the substrate.

Through the Si-Si bonding reaction of the clusters, the clusters are allowed to pull against each other and at the same time the high-orderly silicon clusters are urged to be phase-changed to more high-orderly silicon clusters, that is, crystallized silicon. However, the neighboring clusters still pull against each other through the Si-Si bonds of the neighboring clusters. As a result, a crystal thus obtained has lattice distortion therein, so that the peak of a laser Raman spectrum of the crystal is shifted to a lower wave number than 520 cm$^{-1}$ for a single crystal.

The Si-Si bonds between the clusters serve to anchor (link) the clusters to each other (hereinafter referred to as "anchoring effect"), and energy bands of the clusters are electrically linked through each anchored portion (Si-Si bond) of the clusters to each other due to the anchoring effect. Therefore, the crystal obtained by the above process which is defined as semi-amorphous or semi-crystal in this invention is basically different from the polycrystal silicon in which a grain boundary thereof serves as a barrier against carriers. For example a carrier mobility of 10 to 300 cm$^2$/VSec of this embodiment is obtained.

As described above, the semi-amorphous or semi-crystal as defined above is expected to seemingly have a crystalline property, but electrically have substantially no grain boundaries therein.

Of course, if an annealing temperature is not set to an intermediate annealing temperature of 450° to 700° C. for a silicon semiconductor, but to a higher temperature of 1000° C. or higher in order to perform crystallization inducing crystal growth, oxygen contained in the film is deposited at the grain boundaries and serves as a barrier. In this case, the obtained crystal is equivalent to material including single crystals and grain boundaries.

As the degree of the anchoring (linking) effect between the clusters in the semiconductor film is heightened, the carrier mobility is more increased. In order to heighten the anchoring effect, the amount of oxygen to be contained in the semiconductor film should be decreased below $7 \times 10^{19}$ cm$^{-3}$, and preferably below $1 \times 10^{19}$ cm$^{-3}$. In this case, the crystallization can be performed at a temperature below 600° C., and a high carrier mobility is obtainable.

Next, the preferred embodiments (examples) according to this invention will be described hereunder.

First Embodiment

FIGS. 1(A) to 1(F) are longitudinal-sectional views showing a manufacturing process for an image reading device according to this invention, and in particular a manufacturing process for a photoelectric conversion device portion and P-type and N-type TFT portions.

In FIG. 1(A), a substrate 1 comprises a conductive or insulating substrate. For example, pottery, ceramic or glass material is used as a substrate in this embodiment. The reason for utilization of these materials resides in that these materials have low cost, high mechanical strength and heat-resistance for a film forming process.

In FIG. 1, reference numerals 100, 200 and 300 represent a P-channel TFT (P-type thin film transistor) portion, an N-channel TFT (N-type thin film transistor) portion and a photoelectric conversion device portion, respectively. The substrate 1 comprises glass material such as AN glass, Pyrex glass or the like which has a heat-resistance against a thermal process at a temperature of approximately 600° C. or more.

First, a silicon oxide film 2 having a thickness of 1000 to 3000 Å, which serves as a blocking layer, is formed on the substrate 1 by a magnetron RF(high frequency) sputtering method under the following sputtering condition: 100% oxygen atmosphere, a film-forming temperature of 150° C., an output power of 400 to 800 W and a pressure of 0.5 Pa. Further, quartz or monocrystal silicon is used as a target, and a film-forming speed is 30 to 100 Å/minute.

Thereafter, a silicon semiconductor film 3 is formed on the silicon oxide film 2 by an LPCVD method, a sputtering method or a plasma CVD method.

In a case where the silicon film 3 is formed by a vapor-phase method under reduced pressure (LPCVD), the film-forming process is carried out at 450° C. to 550° C., for example, at 530° C. which is lower than a crystallization temperature by 100 to 200° C., while disilane (Si$_2$H$_6$) or trisilane (Si$_3$H$_8$) is supplied to a CVD device. The following film-forming conditions are adopted: a pressure in a reaction chamber is 30 to 300 Pa, and a film-forming speed is 50 to 250 Å/minute.

In a case where the silicon semiconductor film 3 is formed by the sputtering method, a back pressure before the sputtering is set to $1 \times 10^{-5}$ Pa or less, monocrystal silicon is used as a target, and the film-forming process is carried out in atmosphere including a mixed gas of argon and hydrogen of 20 to 80%, for example, argon of 20% and hydrogen of 80%. Further, the following film-forming conditions are adopted: the film-forming temperature is 150° C., the sputtering frequency is 13.56 MHz, the output power of sputtering is 400 to 800 W and the pressure is 0.5 Pa.

In a case where the silicon semiconductor film 3 is formed by the plasma CVD method, the film is formed at 300° C. by introducing monosilane (SiH$_4$) or disilane (Si$_2$H$_6$) into a PCVD device and applying high frequency power of 13.56 MHz.

The silicon semiconductor film 3 thus obtained includes oxygen preferably below $7 \times 10^{19}$ cm$^{-3}$, and more preferably below $1 \times 10^{19}$ cm$^{-3}$ in concentration. This restriction in concentration of the contained oxygen promotes crystallization degree of the silicon semiconductor film in the crystallizing process thereof. For example, through a secondary-ion mass spectrometry for the silicon semiconductor film thus obtained, concentrations of oxygen, carbon and hydrogen are measured to be $8 \times 10^{13}$ cm$^{-3}$, $3 \times 10^{16}$ cm$^{-3}$ and $4 \times 10^{20}$ cm$^{-3}$, respectively, and these concentration values are extremely small in comparison with the concentration of silicon $4 \times 10^{22}$ cm$^{-3}$ (that is, below one atom %).

After the amorphous-state silicon semiconductor film having a thickness of 2000 Å to 2 microns, for example, 1 micron is formed on the substrate as described above, the silicon semiconductor film 3 on the substrate is subjected to the heat-treatment at an intermediate temperature of 450° to 700° C. in non-oxidation (non-oxide) atmosphere for 12 to 70 hours. For example, the silicon semiconductor film 3 is kept at 600° C. in nitrogen or hydrogen atmosphere.

Since the amorphous silicon oxide film is formed on the surface of the substrate which is located under the silicon semiconductor film 3, the silicon semiconductor film 3 has no specific cores therein in the heat-treatment process. As a result, the silicon semiconductor film 3 is wholly homogeneously annealed with heat. That is, the silicon semiconductor film 3 has an amorphous structure in the film-forming process. In addition, the hydrogen is merely mixedly introduced into the silicon semiconductor film 3.

Through the above annealing treatment, the silicon semiconductor film 3 is phase-changed from an amorphous state to a highly-orderly state, and a part thereof has a crystal state. Particularly, an area which has a relatively highly orderly arrangement in the film-forming process is promoted to be crystallized and the phase state thereof is liable to be changed to the crystal state. However, this area is linked to another area through silicon atoms therebetween, and thus pull against one another. In the laser Raman spectrometry for the area, the spectral peak is observed to be shifted to a lower frequency side than the peak frequency 522 cm$^{-1}$ of the monocrystal silicon. Further, the area is found to have an apparent grain diameter of 50 to 500 Å from calculation using peak width at half height, and thus the area seems to have a microcrystal-like state. In fact, there are many areas having such microcrystal-like state in the silicon semiconductor film, and each of the areas has a cluster structure. These areas are linked through the silicon-anchoring therebetween, so that the silicon semiconductor film 3 has a semi-amorphous structure.

Accordingly, the silicon semiconductor film 3 has a phase state where no grain boundary (hereinafter referred to as "GB") substantially exists. The carriers are easily moved through anchored portions between the clusters, and thus the silicon semiconductor film 3 thus obtained has a higher carrier mobility than the polycrystal silicon having distinct GBs. For example, the silicon semiconductor film of this embodiment has a hole mobility ($\mu$h) of 10 to 200 cm$^2$/Vsec and an electron mobility ($\mu$e) of 15 to 300 cm$^2$/Vsec, and has a carrier diffusion length of several microns to several tens microns which is equal to or longer than the diffusion length of the polycrystal silicon semiconductor.

In a case where in place of the intermediate-temperature annealing treatment, the silicon semiconductor film is subjected to a high-temperature annealing treatment of 900° to 1200° C. to polycrystallize the film, segregation of impurity materials occurs in the silicon semiconductor film 3 due to a solid-phase growth from the cores, and the impurities such as oxygen, carbon, nitrogen and so on are accumulated at the grain boundaries. As a result, the silicon semiconductor film has a high carrier mobility in the crystal areas, but has a lower carrier mobility at the grain boundaries because the accumulation of the impurities at the grain boundaries produces a barrier at each grain boundary and prevents movement of the carriers over the grain boundaries. In fact, it is difficult to obtain a carrier mobility above 10 cm$^2$/Vsec.

As described above, the silicon semiconductor film 3 used in this embodiment has semi-amorphous or semi-crystal structure.

The silicon semiconductor film 3 thus formed is subjected to a patterning process using a photomask by means of a photolithographic technique to leave a necessary portion on the substrate 1, whereby the silicon semiconductor film 3 having a predetermined pattern as shown in FIG. 1(A) is formed on the silicon oxide film 2.

Thereafter, another silicon oxide film 4 of 500 to 2000 Å (e.g. 1000 Å) in thickness is formed on the surface of the silicon semiconductor film 3 and the surface of the silicon oxide film 2 which is exposed to the outside through the patterning process. The formation of the film 4 is carried out in the same manner as that of the silicon oxide film 2. A small amount of fluorine may be added for the second silicon oxide film 4 in the film-forming process. The second silicon oxide film 4 serves as a gate insulating film in the TFT portions 100 and 200.

Figure 1B:
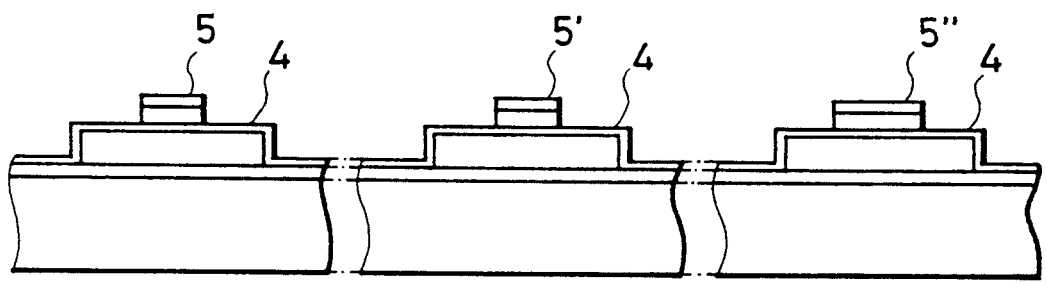

Thereafter, on the second silicon oxide film 4 is formed a silicon semiconductor film including phosphorus of $1 \times 10^{20}$ to $5 \times 10^{20}$ cm$^{-3}$ in concentration, or a multilayer including the phosphorus including silicon semiconductor film and a layer of molybdenum (Mo), tungsten (W), MoSi$_2$ or WSi$_2$ formed on the phosphorus including silicon semiconductor film. The result film is subjected to a patterning process using a second photomask to form an intermediate image reading device having a gate electrode 5 for a P-type TFT and a gate electrode 5' for an N-type TFT on the second silicon oxide film 4 as shown in FIG. 1(B). For example, the intermediate device is so designed that it has a channel length of 10 microns and includes the gate electrodes 5 and 5' comprising a phosphorus-doped silicon semiconductor film of 0.3 micron and a molybdenum film of 0.2 micron on the silicon oxide film 4. Simultaneously with the formation of the gate electrodes 5 and 5', a mask 5" is provided for an I-type semiconductor region on the second silicon oxide film 4 using the same photomask as used for the formation of the gate electrodes 5 and 5'.

Figure 1C:
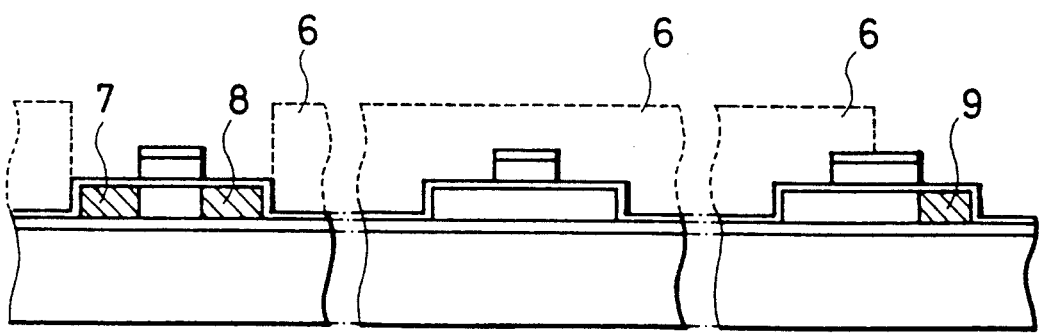
Figure 1D:
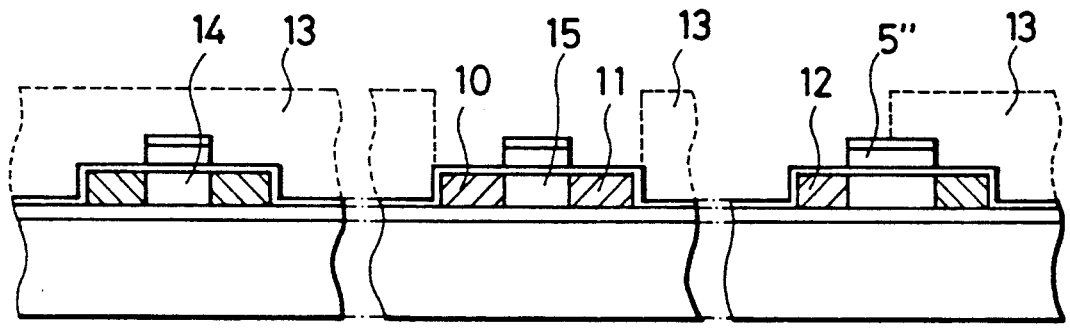

A photoresist 6 indicated by a dotted line of FIG. 1(C) is formed using a photomask. Thereafter, boron is selectively doped into the silicon semiconductor film 3 of the P-type TFT portion 100 (at the left side of FIG. 1(C)) at a dose of $1 \times 10^{15}$ cm$^{-2}$ to form a source 7 and a drain 8 for the P-type TFT portion 100 by an ion injection (ion implantation) method, and at the same time is selectively doped into an area serving as a P-type impurity region 9 of the photoelectric conversion device portion 300. In this doping process, the N-type TFT portion 200, the mask 5" and an area serving as an N-type impurity region of the photoelectric conversion device portion 300 are masked by the same photoresist 6 so that the boron-doping into these areas is prevented Next, another photoresist 13 indicated by a dotted line of FIG. 1(D) is formed using a photomask. Thereafter, phosphorus is selectively doped into the silicon semiconductor film 3 for the N-type TFT portion 200 (at the middle of FIG. 1(D)) at a dose of $1 \times 10^{15}$ cm$^{-2}$ to form a source 10 and a drain 11 for the N-type TFT portion in the ion injection (ion implantation) method, and at the same time is selectively doped into an area serving as the N-type impurity region of the photoelectric conversion device area 300. In this doping process, the P-type TFT portion 100, the P-type impurity region of the photoelectric conversion device portion 300 and the mask 5" are masked by the same photoresist 13 so that the phosphorus-doping into these areas is prevented.

These boron-doping and phosphorus-doping are carried out through the insulating film 4. However, as shown in FIG. 1(B), the gate electrodes 5 and 5' and the mask 5" may be used as a mask to remove the silicon oxide film 4 on the silicon semiconductor film 3, and then boron and phosphorus are directly doped into predetermined areas of the silicon semiconductor film 3 by the ion injection (ion implantation) method.

Next, the heat-annealing treatment is conducted again at 600° C. for 10 to 50 hours, so that the source 7 and drain 8 of the P-type TFT portion 100 and the P-type impurity region 9 of the photoelectric conversion device portion 300 are activated into the respective P+ regions, and the source 10 and drain 11 of the N-type TFT portion 200 and the N-type impurity region of the photoelectric conversion device portion 300 are activated into the respective N+ regions.

In the image reading unit thus constructed, channel forming regions 14 and 15 are formed beneath the gate electrodes 5 and 5', and an intrinsic semiconductor layer is formed as semi-amorphous semiconductor beneath the mask 5''.

Through the manufacturing process for forming the image reading unit as described above, complementary type of TFTs and a photoelectric conversion device can be formed without elevating a temperature to 700° C. or higher in the heating treatment thereto even though it is manufactured in a self-aligning system. Therefore, materials such as quartz which is high in price are not necessarily used as a substrate, and thus this manufacturing process is remarkably suitable for the image reading device of this invention.

In this embodiment, the heat-annealing treatment is conducted twice at the steps of FIGS. 1(A) and 1(D). However, the annealing treatment of the first step of FIG. 1(A) may be eliminated in accordance with characteristics required for the image reading unit. Further, the twice annealing treatments at the steps of FIGS. 1(A) and 1(D) may be replaced by one annealing treatment of FIG. 1(D) to shorten a manufacturing time.

Next, the areas other than the photoelectric conversion device portion 300 are masked by a photoresist which is obtained using a photomask, and the mask 5'' on the silicon semiconductor film 3 of the photoelectric conversion device portion 300 is removed by a dry or wet type etching process.

Figure 1E:
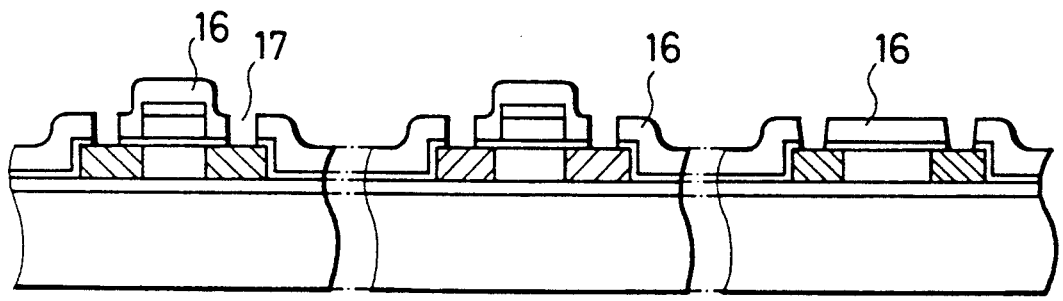

Thereafter, a layer insulation member 16 as shown in FIG. 1(E) is formed on the image reading unit by the sputtering method in the same manner as used for the formation of the silicon oxide film. The layer insulation member 16 thus obtained has a thickness of 0.2 to 0.7 micron. This layer insulation member 16 (silicon oxide film) may be formed by the LPCVD method or an optical CVD method. Thereafter, windows 17 for the electrodes are formed as shown in FIG. 1(E) using a photomask.

Thereafter, an aluminum film is formed on the overall surface of the image reading unit by the sputtering method, and patterned into leads 18, 19, 20, 21, 22 and 23 by a photomask.

Figure 1F:
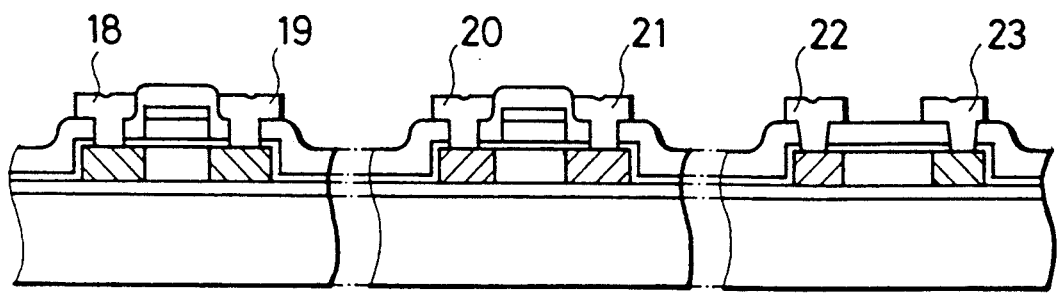

Through a series of processes as described above, the P-type TFT portion 100, the N-type TFT portion 200 and the photoelectric conversion device portion 300 are formed on the same glass substrate 1 using the same silicon semiconductor film. FIG. 1(F) shows the image reading unit which is finally completed through the above processes. The following is characteristics (carrier mobility and threshold voltage Vth) of the P-type TFT and the N-type TFT, respectively.

|      | MOBILITY ($cm^2/Vs$) | VtH (V) |
| ---- | --- | --- |
| PTFT | 20  | -3  |
| NTFT | 30  | +3  |

By using the silicon semiconductor film as described above, the TFT can be provided with a large mobility which has not been conventionally obtainable. In this embodiment, the N-type TFT is used as a switching element for an output of the photoelectric conversion device, and the TFTs having the complementary structure are used in a peripheral image reading circuit.

A conventional photoelectric conversion device has positive and negative electrodes which are arranged in a laminating direction of the semiconductor films in such a manner that the semiconductor film is sandwiched between the positive and negative electrodes. In this sandwiching structure of the electrodes and the semiconductor film, if a pinhole is unintentionally formed in the semiconductor film in the film-forming process, a short-circuit frequently occurs between the positive and negative electrodes. However, in the photoelectric conversion device according to this embodiment, the positive and negative electrodes are not arranged in the laminating direction of the semiconductor film, and therefore no short-circuit occurs between the positive and negative electrodes due to a pinhole in the semiconductor film. As a result, the photoelectric conversion device of this embodiment has an extremely low leakage current.

SECOND EMBODIMENT

Figure 2:
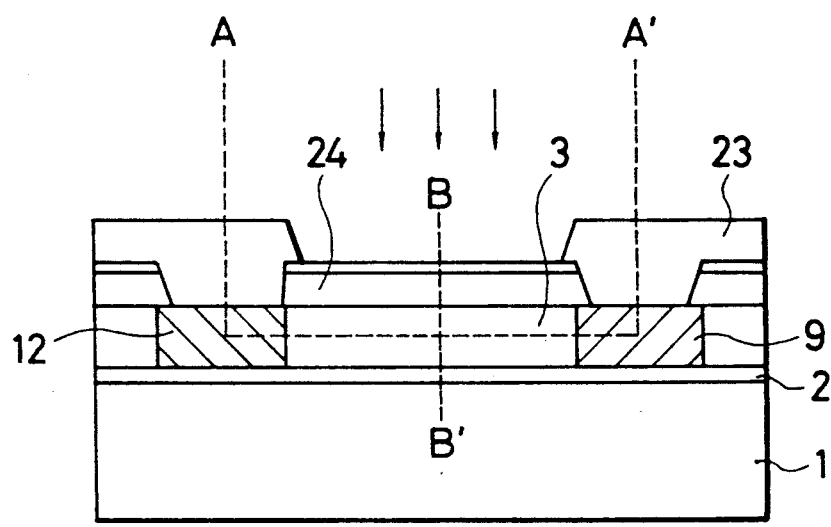
FIG. 2 is a longitudinal-sectional view for another embodiment of the image reading device according to this invention.

FIG. 2 shows another embodiment of the photoelectric conversion device portion of the image reading device, which has substantially the same structure as that of the first embodiment, except that an amorphous silicon semiconductor film 24 of 3000 Å in thickness is further formed on a light-irradiating surface side of the semiconductor film 3. The other film-forming processes are identical to those of the first embodiment.

The amorphous silicon semiconductor film 24 has a larger absorption coefficient than that of the semiconductor film 3. Accordingly, upon light-irradiation, a large amount of carriers are produced in the amorphous silicon semiconductor film 24, and then drift through the semiconductor film 3 and are outputted through the positive and negative electrodes to the outside.

At the same time, carriers are also produced in the semiconductor film 3. The photosensitivity of the semiconductor film 3 is dependent on the wavelength of the irradiated light. Therefore, in the second embodiment, light having a wide wavelength range may be converted to electricity.

Further, since the amorphous silicon semiconductor film 24 has a wider energy band width than the semiconductor film 3, the carriers which are generated in the semiconductor film 3 are prevented from drifting to the semiconductor film 24, while the carriers which are generated in the semiconductor film 24 are promoted to drift to the semiconductor film 3 along a gradient of the energy band of the semiconductor film 24. Therefore, in this embodiment, the generated carriers can be more effectively outputted to the outside.

Figure 3A:
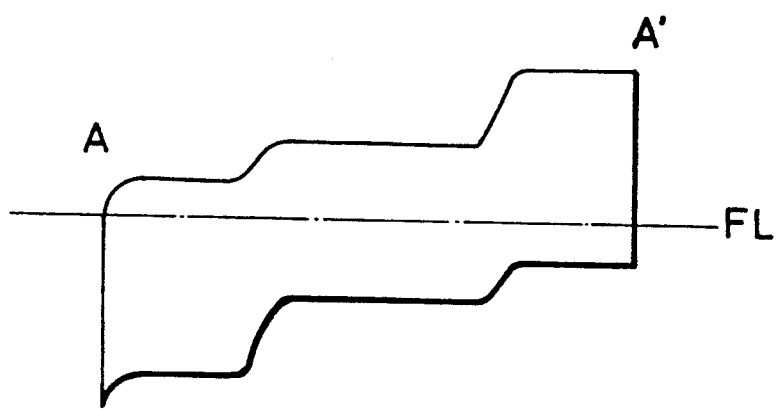
FIGS. 3(A) and 3(B) show energy band diagrams for the embodiment of FIG. 2.
Figure 3B:
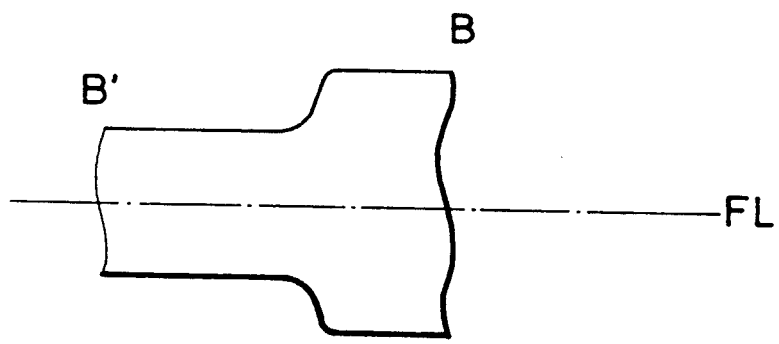

FIGS. 3(A) and 3(B) show the energy bands of the semiconductor films 3 and 24 to diagrammatically explain the above effect of the energy bands, where FIG. 3(A) shows an energy band for a longitudinal section of the photoelectric conversion device of FIG. 2 which is taken along a line A-A', and FIG. 3(B) shows an energy band for a cross section of the photoelectric conversion device of FIG. 2 which is taken along a line B-B'.

THIRD EMBODIMENT

The image reading device of this third embodiment has substantially the same construction as the first embodiment, except for the following point.

Only the N-type TFT includes the same semiconductor film as used for the photoelectric conversion device, and is formed simultaneously with the formation of the N-type impurity region of the photoelectric conversion device 300. At the time when the P-type impurity region is formed in the photoelectric conversion device portion 100, the TFT portion is masked by a photoresist, and thus no P-type impurity is doped. In this embodiment, unlike the complementary type of TFT, it is not necessary to coincide Vth between the P-type TFT and the N-type TFT. Accordingly, a permissible range for the manufacturing process is broadened.

In the embodiments as described above, the light is irradiated from an opposite side to the substrate. However, the light-irradiating direction is not limited to the above direction, and the light may be irradiated from the substrate side. In this case, if an electrical characteristic of the semiconductor is influenced by variation of the photosensitivity of the semiconductor film due to alteration of the light-irradiating direction, a light-shielding film may be provided if occasion demands.

In place of provision of the light-shielding film, the thickness of the semiconductor film is increased, and an element such as oxygen, nitrogen or the like is added at the substrate side of the semiconductor film to partly degrade the photosensitivity of the semiconductor film. In this case, it is unnecessary to insulate the light-shielding film, and thus the same effect is obtained using a more simple process.

According to this invention, the image reading device is implemented with a simple manufacturing process and in low cost. That is, the number of steps for the process and the number of photomasks used in the process can be reduced. Further, a part of the image reading circuit is integrally formed on the substrate and the TFT having high photoresponsivity is utilized, so that the device can be miniaturized in size and perform a high-speed image reading operation.

In addition, the complementary structure can be formed by the simple and low-cost process, so that degree of freedom in design of the image reading circuit is increased, and elements behind the image reading circuit can be easily formed by an IC-forming technology.

Further, since the carriers generated by the light irradiation are diffused in a direction parallel to the surface of the semiconductor film, the carriers suffer no disturbance of their drifting by an interface or boundary which is formed in the laminating or thickness direction of the semiconductor film. Therefore, the generated carriers can be effectively outputted to the outside.

Still further, the positive and negative electrodes of the image reading device are formed only on the surface thereof, so that an influence of thermal stress is negligible in the semiconductor film forming process.

Still further, material having low cost such as pottery, ceramic, glass or the like is used as a substrate and the thickness of the semiconductor layer which is formed on the substrate is as small as 1 to 50 microns, so that the cost of the materials is remarkably low.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A device for reading an image comprising:
   a semiconductor layer formed on a substrate, said semiconductor layer comprising an image sensor region and a semiconductor switch region adjacent to and operatively connected with said image sensor region,
   wherein said semiconductor layer has a semi-amorphous structure comprising a mixture of amorphous and crystalline structures, in which a Raman spectrum of the semiconductor film exhibits a peak deviated from that which stands for a single crystal of the semiconductor.

2. The device of claim 1 wherein said semiconductor layer comprises hydrogen doped silicon.

3. The device of claim 1 wherein said semiconductor switch region comprises a thin film transistor of which active region is formed of said semiconductor layer.

4. The device of claim 1 wherein said image sensor region comprises at least two semiconductor regions having different electrical properties and forming a junction.

5. A device for reading an image produced by a process comprising the steps of:
   depositing a semiconductor material on a substrate;
   forming a photoelectric conversion semiconductor device on said substrate comprising a p-type impurity semiconductor region, an intrinsic semiconductor region, and an n-type impurity semiconductor region, a semiconductor region of said photoelectric conversion semiconductor device being made of said semiconductor material; and
   forming a thin film transistor on said substrate which constitutes an electric circuit required to read an image, a semiconductor region of said thin film transistor being made of said semiconductor material;
   wherein said semiconductor regions are arranged in order with said p-type impurity semiconductor region adjacent said intrinsic semiconductor region and said intrinsic semiconductor region adjacent said n-type impurity semiconductor region in said photoelectric conversion semiconductor device, said order being in a direction perpendicular to that in which an image light to be read is incident thereon.

6. The device of claim 4 wherein said two semiconductor regions of the image sensor region are laterally arranged on said substrate.

7. The device of claim 5 wherein said photoelectric conversion semiconductor device further comprises an amorphous semiconductor film provided on a side of said intrinsic semiconductor region on which said image light is incident through said amorphous semiconductor film.

8. A device for reading an image comprising:
   a semiconductor layer formed on a substrate, said semiconductor layer comprising an image sensor region and a semiconductor switch region adjacent to and operatively connected with said image sensor region.
   wherein said semiconductor layer has at least one of an electron mobility 15–100 $cm^2/V \cdot sec$ and a hole mobility 10–100 $cm^2/V \cdot sec$.

9. A device for reading an image comprising:

a semiconductor layer formed on a substrate, said semiconductor layer comprising an image sensor region and a semiconductor switch region adjacent to and operatively connected with said image sensor region, wherein said semiconductor layer has a semi-amorphous structure in which a Raman spectrum of the semiconductor film exhibits a peak deviated from that which stands for a single crystal of the semiconductor, and said semiconductor switch region comprises complementary p-channel and n-channel thin film transistors.

10. The device of claim 9 wherein said semiconductor film comprises hydrogen doped silicon.

11. The device of claim 9 wherein said image sensor region comprises at least two semiconductor regions having different electrical properties and forming a junction.

12. The device of claim 11 wherein said two semiconductor regions in said image sensor region are arranged in a lateral direction on said substrate.

13. The device of claim 9 wherein said semiconductor layer has at least one of an electron mobility in a range from 15 to 100 $cm^2/V \cdot sec$ and a hole mobility in a range from 10 to 100 $cm^2/V \cdot sec$.

14. The device of claim 1 wherein said semiconductor layer has at least one of an electron mobility in a range from 15 to 100 $cm^2/V \cdot sec$ and a hole mobility in a range from 10 to 100 $cm^2/V \cdot sec$.

* * * * *